United States Patent
Haynes et al.

(10) Patent No.: US 10,531,555 B1
(45) Date of Patent: Jan. 7, 2020

(54) TUNGSTEN OXIDE THERMAL SHIELD

(71) Applicant: U.S. Government as Represented by the Secretary of the Army, Picatinny Arsenal, Dover, NJ (US)

(72) Inventors: Aisha Haynes, Piscataway, NJ (US); Calvin Lim, Elizabeth, NJ (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 88 days.

(21) Appl. No.: 15/465,728

(22) Filed: Mar. 22, 2017

Related U.S. Application Data

(60) Provisional application No. 62/311,492, filed on Mar. 22, 2016.

(51) Int. Cl.
| | | |
|---|---|---|
| *H05K 1/02* | (2006.01) | |
| *C04B 35/495* | (2006.01) | |
| *B32B 19/02* | (2006.01) | |
| *B32B 33/00* | (2006.01) | |

(52) U.S. Cl.
CPC ............ *H05K 1/0201* (2013.01); *B32B 19/02* (2013.01); *B32B 33/00* (2013.01); *C04B 35/495* (2013.01); *B32B 2307/306* (2013.01); *B32B 2571/00* (2013.01); *C01P 2006/32* (2013.01)

(58) Field of Classification Search
None
See application file for complete search history.

(56) References Cited

U.S. PATENT DOCUMENTS

| | | | | |
|---|---|---|---|---|
| 3,663,182 A | * | 5/1972 | Hamling | C04B 35/62231 252/638 |
| 3,818,165 A | * | 6/1974 | Zavitsanos | H01H 33/76 218/150 |
| 3,827,784 A | * | 8/1974 | Giglia | G02F 1/1523 252/500 |
| 3,978,007 A | * | 8/1976 | Giglia | G02F 1/1523 252/506 |
| 4,306,773 A | * | 12/1981 | Arnoldussen | G02F 1/1523 204/164 |
| 4,325,611 A | * | 4/1982 | Huggins | G02F 1/1523 252/519.1 |
| 4,333,861 A | * | 6/1982 | Aoki | H01C 7/108 252/517 |

(Continued)

FOREIGN PATENT DOCUMENTS

| | | | | |
|---|---|---|---|---|
| FR | 2839318 A1 | * | 11/2003 | ............ C23C 26/00 |
| JP | 2010197847 | * | 9/2010 | |
| JP | 201165000 | * | 3/2011 | |

OTHER PUBLICATIONS

Psyclops. Density of Materials. Jan. 1, 2004. "www.psyclops.com/tools/technotes/materials/density.html." (Year: 2004).*

*Primary Examiner* — Timothy J Thompson
*Assistant Examiner* — Muhammed Azam
(74) *Attorney, Agent, or Firm* — John P. DiScala

(57) ABSTRACT

A tungsten trioxide thermal shield for electronic components in a gun launched munition includes tungsten trioxide grains suspended in a binder. The thermal shield is made such that a tungsten trioxide rich layer is adjacent the electronic component and a binder rich layer opposes the tungsten trioxide rich layer.

7 Claims, 6 Drawing Sheets

(56) References Cited

U.S. PATENT DOCUMENTS

| | | | | |
|---|---|---|---|---|
| 4,430,405 A * | 2/1984 | Ono | G03G 5/087 | 252/501.1 |
| 4,545,929 A * | 10/1985 | Masuyama | H01C 7/115 | 252/520.21 |
| 4,793,695 A * | 12/1988 | Wada | G02F 1/1525 | 359/270 |
| 4,977,007 A * | 12/1990 | Kondo | G02F 1/1525 | 264/104 |
| 5,028,580 A * | 7/1991 | Shimomura | B41M 5/426 | 427/152 |
| 5,372,797 A * | 12/1994 | Dunmead | B82Y 30/00 | 423/439 |
| 5,430,230 A * | 7/1995 | Mitsui | B01D 53/8662 | 423/240 S |
| 5,476,716 A * | 12/1995 | Gallo | C08G 59/30 | 257/702 |
| 5,621,162 A * | 4/1997 | Yun | G01N 27/125 | 73/23.2 |
| 5,855,849 A * | 1/1999 | Li | G01N 27/121 | 422/88 |
| 5,888,712 A * | 3/1999 | Lelental | B41M 5/426 | 430/527 |
| 5,985,781 A * | 11/1999 | Lee | C04B 35/495 | 501/135 |
| 6,051,277 A * | 4/2000 | Claussen | B22F 3/26 | 427/192 |
| 6,383,684 B1 * | 5/2002 | Yoshimura | C01G 41/00 | 429/218.1 |
| 6,432,540 B1 * | 8/2002 | Gallo | C08K 3/22 | 257/E23.119 |
| 6,660,811 B2 * | 12/2003 | Ogura | C08G 59/245 | 257/E23.007 |
| 6,740,260 B2 * | 5/2004 | McCord | G21F 1/106 | 250/505.1 |
| 6,821,557 B2 * | 11/2004 | Lee | C23C 26/00 | 427/180 |
| 7,338,993 B2 * | 3/2008 | Ahsan | C08G 59/08 | 524/101 |
| 7,429,427 B2 * | 9/2008 | Wu | C23C 14/0036 | 428/836.2 |
| 7,456,235 B2 * | 11/2008 | Heschke | C09D 5/033 | 523/400 |
| 7,559,494 B1 * | 7/2009 | Yadav | A61L 27/06 | 241/23 |
| 7,763,794 B2 * | 7/2010 | Hantschel | H01L 31/03529 | 136/243 |
| 8,263,714 B2 * | 9/2012 | Ogura | C08G 8/10 | 525/396 |
| 8,790,614 B2 * | 7/2014 | Richards | B82Y 30/00 | 423/418.2 |
| 9,556,061 B2 * | 1/2017 | Naito | C03C 8/24 | |
| 2002/0009383 A1 * | 1/2002 | Kawaura | C23C 8/02 | 420/418 |
| 2002/0143091 A1 * | 10/2002 | Gallo | C08K 3/22 | 524/431 |
| 2003/0082437 A1 * | 5/2003 | Sotomura | H01M 4/60 | 429/111 |
| 2004/0166325 A1 * | 8/2004 | Gallo | C08G 59/08 | 428/413 |
| 2006/0222890 A1 * | 10/2006 | Itoh | H01L 51/0004 | 428/690 |
| 2007/0059555 A1 * | 3/2007 | Iizumi | H01L 51/0012 | 428/690 |
| 2008/0003503 A1 * | 1/2008 | Kawakami | H01G 9/155 | 429/231.5 |
| 2008/0254267 A1 * | 10/2008 | Chen | B41M 7/0027 | 428/207 |
| 2008/0308775 A1 * | 12/2008 | Yabuki | D01F 1/10 | 252/587 |
| 2009/0236945 A1 * | 9/2009 | Yamamoto | C04B 35/491 | 310/358 |
| 2010/0113254 A1 * | 5/2010 | Sato | B01J 23/30 | 502/150 |
| 2012/0052265 A1 * | 3/2012 | Le Bris | A47J 36/02 | 428/204 |
| 2012/0305863 A1 * | 12/2012 | Togashi | C08K 5/357 | 252/587 |
| 2013/0004407 A1 * | 1/2013 | Wei | C01B 32/949 | 423/440 |
| 2013/0100583 A1 * | 4/2013 | Ito | H01G 9/058 | 361/502 |
| 2013/0200292 A1 * | 8/2013 | Fung | C09D 5/004 | 252/62 |
| 2013/0213852 A1 * | 8/2013 | Yamazaki | C03C 8/08 | 206/701 |
| 2013/0280447 A1 * | 10/2013 | Suzuki | B60J 3/007 | 428/34 |
| 2013/0344255 A1 * | 12/2013 | Seok | C09D 5/084 | 427/448 |
| 2014/0017503 A1 * | 1/2014 | Hashimoto | B32B 17/10036 | 428/421 |
| 2014/0106175 A1 * | 4/2014 | Fujita | B32B 17/10633 | 428/432 |
| 2014/0127522 A1 * | 5/2014 | Fujita | B82Y 30/00 | 428/523 |
| 2014/0291156 A1 * | 10/2014 | Ezura | C25D 1/04 | 205/50 |
| 2014/0335364 A1 * | 11/2014 | Fujita | B32B 17/10036 | 428/437 |
| 2016/0060160 A1 * | 3/2016 | Machida | B32B 17/10651 | 428/432 |
| 2016/0122524 A1 * | 5/2016 | Machida | C08L 33/06 | 428/522 |
| 2016/0229737 A1 * | 8/2016 | Naito | C03C 8/24 | |
| 2017/0343183 A1 * | 11/2017 | Wake | C09K 3/00 | |

* cited by examiner

| Nano - 66nm particle size | | | | | | | | |
|---|---|---|---|---|---|---|---|---|
| %wt/vol WO₃ | %Binder in WO₃ rich layer | %WO₃ in WO₃ rich layer | K (W/mK) | Length (m) | R (°C/W) | Q(-50 to Ambient) | Q (Ambient to 70) | Q (-50 to 70) |
| 9 | 20.94% | 79.06% | 0.108 | 0.0044 | 606.8496 | 0.1236 | -0.0742 | 0.1977 |
| 20 | 23.78% | 76.22% | 0.070 | 0.0056 | 1195.1653 | 0.0628 | -0.0377 | 0.1004 |
| 33 | 20.25% | 79.75% | 0.057 | 0.0069 | 1800.4003 | 0.0417 | -0.0250 | 0.0667 |
| 43 | 25.53% | 74.47% | 0.056 | 0.0078 | 2075.0431 | 0.0361 | -0.0217 | 0.0578 |
| Micro - 18.9 micron particle size | | | | | | | | |
| %wt/vol WO3 | %Binder in WO₃ rich layer | %WO3 in WO3 rich layer | K (W/mK) | Length (m) | R (°C/W) | Q(-50 to Ambient) | Q (Ambient to 70) | Q (-50 to 70) |
| 9 | 19.01% | 80.99% | 0.128 | 0.0029 | 338.0481 | 0.2219 | -0.1331 | 0.3550 |
| 20 | 18.30% | 81.70% | 0.115 | 0.0029 | 377.9053 | 0.1985 | -0.1191 | 0.3175 |
| 43 | 14.97% | 85.03% | 0.078 | 0.0061 | 1156.7805 | 0.0648 | -0.0389 | 0.1037 |

FIG. 6

TUNGSTEN OXIDE THERMAL SHIELD

CROSS-RELATED APPLICATIONS

This application claims the benefit of under 35 USC § 119(e) of U.S. provisional patent application 62/311,492 filed on Mar. 22, 2016.

STATEMENT OF GOVERNMENT INTEREST

The inventions described herein may be manufactured, used and licensed by or for the United States Government.

BACKGROUND OF THE INVENTION

The invention relates in general to electronic packaging and in particular to thermal shielding for electronic components.

Lifecycle sustainability and reliability are key requirements for gun launched munitions. Due to the long storage shelf life and wide range of operational conditions experienced, gun launched munitions are expected to maintain functionality in a large thermal environmental range. For example, over its operational lifetime, a typical gun launched munition may experience storage environments ranging from arctic conditions to desert conditions and be exposed to temperatures reaching 400° F. Accordingly, such munitions are tested in thermal extremes to ensure lifecycle sustainability and reliability. The current storage requirement thermal range for gun launched munitions is from −50° C. to 71° C.

Electronic components and other thermally sensitive components exposed to thermal shock (i.e. extreme thermal gradients) can experience low reliability and failures. For example, these failures may be heat aging, structural overloading induced by thermal expansion mismatch (between component, potting and solder), swelling/contraction of component, joint fatigue and failure, cracking in components and diminished electrical components.

Ceramics are known thermally resistant materials. Current thermal barrier oxide materials are primarily employed in industries where metallic components are exposed to high heat thermal cycling (i.e. >1100° C.). Because of this, most commercial thermal barrier oxides are processed and operated at extremely high temperatures to obtain and maintain stable oxide phases. Heat shields or thermal shields such as traditional thermal barrier oxides are processed via physical or chemical vapor deposition, thermal spray or plasma spray coating techniques.

There are disadvantages to the above processes for developing thermal barrier oxides and heat shields from traditional materials for gun launched electronics applications. Primarily, the high temperature deposition processes required to ensure adhesion to the substrate fall outside the thermal tolerance range of many electronics components. Additionally, the current thermal barrier oxide systems are unstable in the operating range of munition electronics components and thus may not adequately function as a thermal shield potentially yielding similar physical and functional failures of electronics components observed during thermal cycling and thermal shock. Finally, the adhesion quality between current thermal oxide shields and non-metallic components is questionable.

Currently, potting materials may be used for some thermal insulation for an electronics component. However, potting is known to exhibit unstable material properties with thermal variances. Additionally, thermal mismatch between the potting and the ceramic component lends itself to potential hardware failures.

A need exists for a thermal shield which protects electronic components, such as those used in a gun launched munition, from the effects of thermal shock.

SUMMARY OF INVENTION

One aspect of the invention is a thermal shield for an electronic component subject to a wide temperature variance. The thermal shield includes tungsten trioxide grains in a binder material. The thermal shield includes a tungsten trioxide rich layer and a binder rich layer.

A second aspect of the invention is an electronic component for a gun launched munition. The electronic component is potted in a thermal shield. The thermal shield includes tungsten trioxide grains suspended in a binder and organized into a tungsten trioxide rich layer adjacent the electronic component and a binder rich layer adjacent the external environment.

A third aspect of the invention is a method for providing a thermal shield for electronic components. The method comprises the steps of mixing tungsten trioxide powder with a binder; applying the mixed tungsten trioxide powder and binder on an electronic device; curing under conditions such that a portion of the tungsten trioxide settles adjacent to the electronic device producing a tungsten trioxide rich layer.

The invention will be better understood, and further objects, features and advantages of the invention will become more apparent from the following description, taken in conjunction with the accompanying drawings.

BRIEF DESCRIPTION OF THE DRAWINGS

In the drawings, which are not necessarily to scale, like or corresponding parts are denoted by like or corresponding reference numerals.

FIG. 6 is a table showing test results for the heat transfer rate for the thermocouples according to particle size, concentration and thickness, in accordance with an illustrative embodiment of the invention.

DETAILED DESCRIPTION

A tungsten trioxide thermal shield protects electronic components, such as those employed in a gun launched munition from thermal shock associated with thermal cycling. The tungsten trioxide shield is processed and applied under conditions conducive to its use as a thermal shield for an electronic component. Additionally, the tungsten trioxide thermal shield disclosed herein is stable and functional in the thermal range of −50 C to 71 C required for gun launched munitions.

Figure 1:
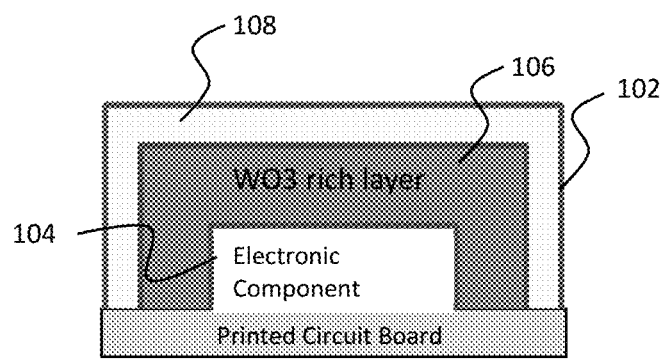
FIG. 1 illustrates an electronic component with a tungsten trioxide thermal shield, in accordance with an illustrative embodiment.

FIG. 1 illustrates an electronic component with a tungsten trioxide thermal shield, in accordance with an illustrative embodiment. A tungsten trioxide thermal shield 102 protects electronic components 104, such as those employed in a gun launched munition, from thermal shock associated with thermal cycling. The thermal shield 102 is composed of tungsten trioxide in a binder material. The material properties of the tungsten trioxide provide the thermal management properties. The binder allows the tungsten trioxide to conform to and adhere to the surface of the thermal shield 102 and provided compatibility between the thermal shield 102 and any subsequent potting material employed to protect from setback loads and high frequency, vibrations. The thermal shield 102 may be applied directly to the electronic component 104 such as via dip coating or potting for an electronic assembly.

The tungsten trioxide comprises monoclinic polymorph grains mixed with a binder with a weight percentage of tungsten trioxide in the range of approximately 10-75% wt/vol. In an embodiment, the binder is polyurethane; however, the binder is not limited to polyurethane and in alternative embodiments the binder may be epoxy, acrylic, poly vinyl alcohol, urethane or silicone based.

In an embodiment, the particle sizes of the tungsten trioxide powders are in the range of 60 nanometers to 30 microns. It will be appreciated that the thermal conductivity and response rate of the thermal shield 102 is sensitive to grain size with smaller particles providing improved performance of the thermal shield 102 and further reduce the heat transfer rate of the thermal shield 102. This is largely due to the available free surface area which increases with decreasing grain size.

Figure 2:
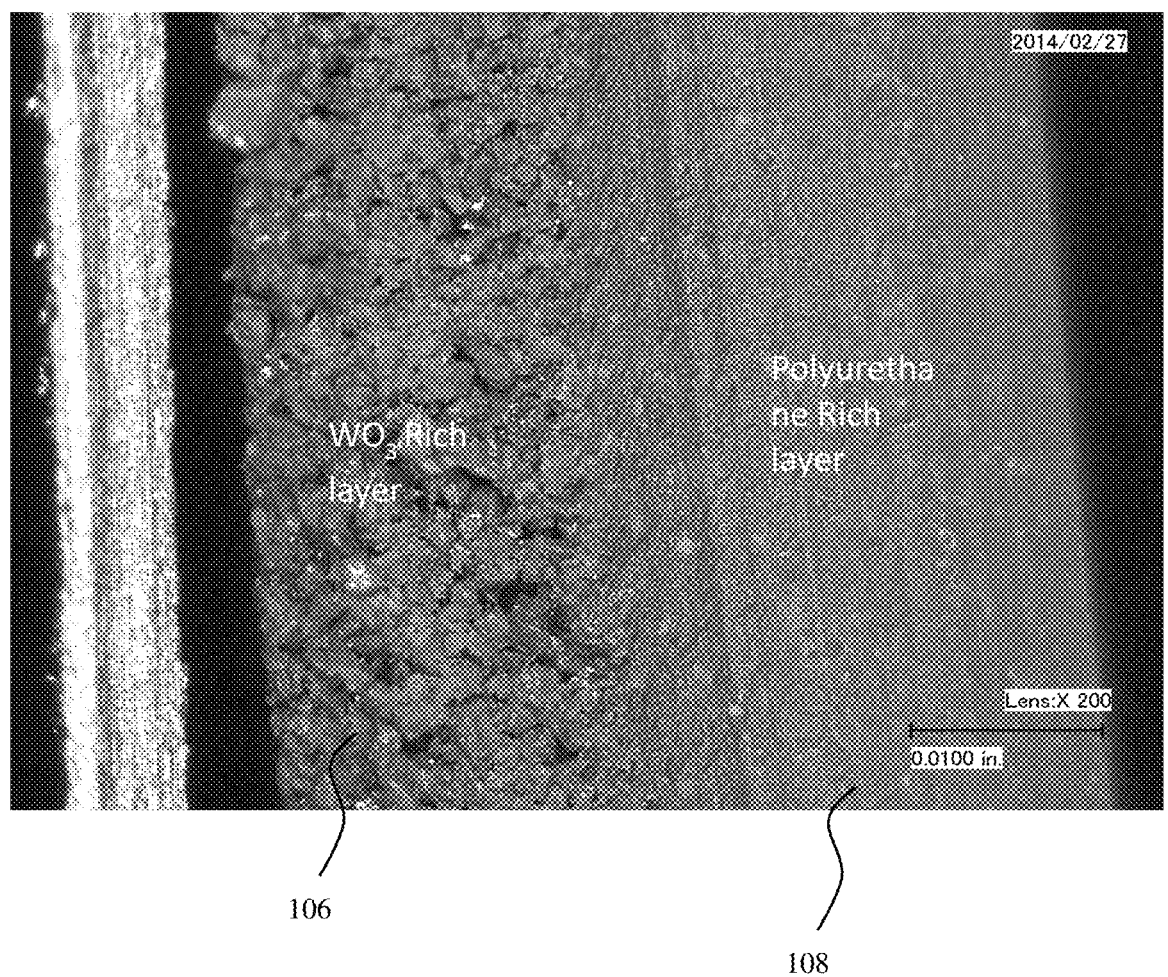
FIG. 2 is an image of a tungsten trioxide thermal shield, in accordance with an illustrative embodiment.

The thermal shield 102 comprises a tungsten trioxide rich layer 106 and a binder rich layer 108. FIG. 2 is an image of a tungsten trioxide thermal shield 102, in accordance with an illustrative embodiment. The tungsten trioxide rich layer 106 is positioned adjacent to the electronic component 104. The binder rich layer 108 is directed toward the external environment, although not necessarily in contact with the external environment. In applications in which potting material is employed for protection during gun launch or high frequency vibration, the binder rich layer 108 may be in communication with the potting material or serve as an intermediate layer. In an embodiment of the invention, the thermal shield 102 may be mixed in with the potting binder or may independently serve as a potting composite material thereby providing both the thermal protection and protection due to forces.

The thickness of the tungsten trioxide rich layer 106 is dependent on the weight percentage of the tungsten trioxide. In an embodiment of the invention, the tungsten oxide rich layer comprises of 75-85% of the total tungsten trioxide in the thermal shield 102. In such an embodiment, a thin transition layer separates the tungsten trioxide rich layer 106 from the binder rich layer 108; however, the two layers are generally distinct layers with a clear delineation. In other embodiments in which a more viscous binder material is employed, the thermal shield 102 has a more gradient transition from binder rich to tungsten rich, with a thicker transition layer between the binder rich layer 108 and the tungsten trioxide rich layer 106.

Figure 3:
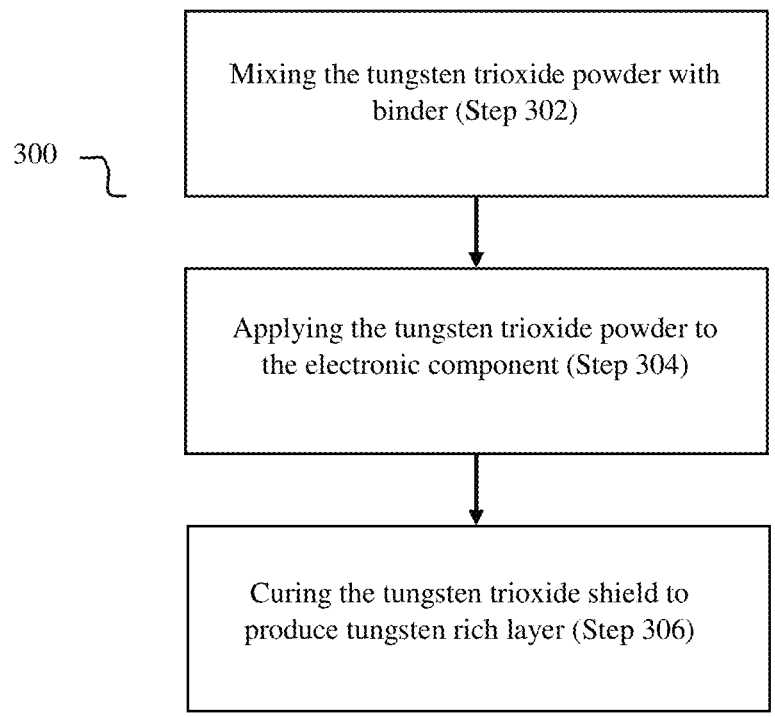
FIG. 3 illustrates a flowchart for a method of providing a tungsten trioxide thermal shield, in accordance with an illustrative embodiment.

FIG. 3 illustrates a flowchart for a method of providing a tungsten trioxide thermal shield 102, in accordance with an illustrative embodiment. The method 300 includes the steps of: mixing tungsten trioxide powder with the binder 302; applying the tungsten trioxide and binder mixture to an electronic component 304; and curing the mixture at conditions sufficient for producing a tungsten trioxide rich layer 306.

At step 302, the tungsten trioxide power is mixed with the binder. The tungsten trioxide is in powder form. In a preferred embodiment, the tungsten trioxide powder has grains in the range of 60 nm to 30 um. However, the thermal shield 102 is not limited to tungsten trioxide grains of 60 nm to 30 um, Upon mixing, the tungsten trioxide and binder mix is in a gel phase.

At step 304, the mixed tungsten trioxide and binder is applied to the electronic component 104. For example, in an embodiment of the invention, the electronic component 104 is dip coated in the gel mixture. For certain electronic packages 104, particularly those used in gun launched munitions, the electronic package 104 may be potted due to the operational and environmental conditions of the electronic package 104. In such an application, the electronic package 104 may be potted in the thermal shield 102. In yet another embodiment, the tungsten trioxide and binder mix may be sprayed onto the electronic component 104.

At step 306, the tungsten trioxide and binder mixture is cured under conditions such that a tungsten trioxide rich layer 106 is formed adjacent to the electronic component 104. In an embodiment of the invention in which the thermal shield 102 comprises both a tungsten trioxide rich layer 106 and a binder rich layer 108, the tungsten trioxide and binder mixture is cured at room temperature under ambient conditions. However, the choice of cure process is largely governed by the cure process of the binder. The electronic component 104 coated with the mixture is oriented such that the tungsten trioxide particles settling under the force of gravity, settle adjacent to the electronic component 104. Thereby, the tungsten trioxide rich layer 106 is adjacent to the electronic component 104 and the binder rich layer 108 is oriented toward the external environment.

In another embodiment of the invention, the tungsten trioxide and binder mixture may be thermally treated such that a substantial portion of the binder material is removed from the mixture. After such treatment, a single dense tungsten trioxide rich layer 106 is formed as the thermal shield 102.

Test Data

Tests were performed by the inventors to determine whether a tungsten trioxide thermal shield 102 would protect an electronic component from the effects of thermal shock. The tests performed by the inventors comprised embedding K-type wire thermocouples in a tungsten trioxide thermal shield 102 and subjecting the thermocouples to a multiple thermal shocks between −53 C and 71 C. The temperature range represents the thermal storage requirements for most munitions. The temperature of the thermocouples was recorded and a rate of change of temperature was determined from the recorded temperatures. For control purposes, an uncoated K-type wire thermocouple and a thermocouple potted in polyurethane were subjected to the multiple thermal shocks.

Inframat Advanced Materials micro-sized Tungsten Oxide, Product number 74R-0801Y Lot number IAM1270TYO and Inframat Advanced Materials nano-sized Tungsten Oxide, Product number 74N-0814 Lot number IAM9029WON4 were mixed with PRO Finisher water-base polyurethane and cast onto an Omega type K SC series thermocouples. In the micro-sized tungsten oxide, the average grain size used was 18.9 micrometers. In the nano-sized tungsten trioxide, the average particle size used was 66 nanometers.

For each of the two sizes of tungsten trioxide, mixtures were prepared having mass concentrations of 9%, 20%, 33% and 43% tungsten trioxide. The tungsten trioxide thermal shield 102 test samples were cast in a high density polyethylene mold. The mold well averaged 0.51 inches deep and had a diameter of 0.365 inches. After the cast tungsten trioxide thermal shield 102 was cured a tungsten trioxide rich layer was observed in each sample. The tungsten trioxide rich layer varied between 0.17 inches and 0.30 inches according to the mass concentration of the tungsten trioxide, with higher mass concentrations corresponding to thicker layers.

As shown in the figures below, the thermocouples encapsulated in the tungsten oxide rich layer are shown to reduce heat transfer rate of the thermocouple up to 80 percent at 70 C and −51 C.

Figure 4:
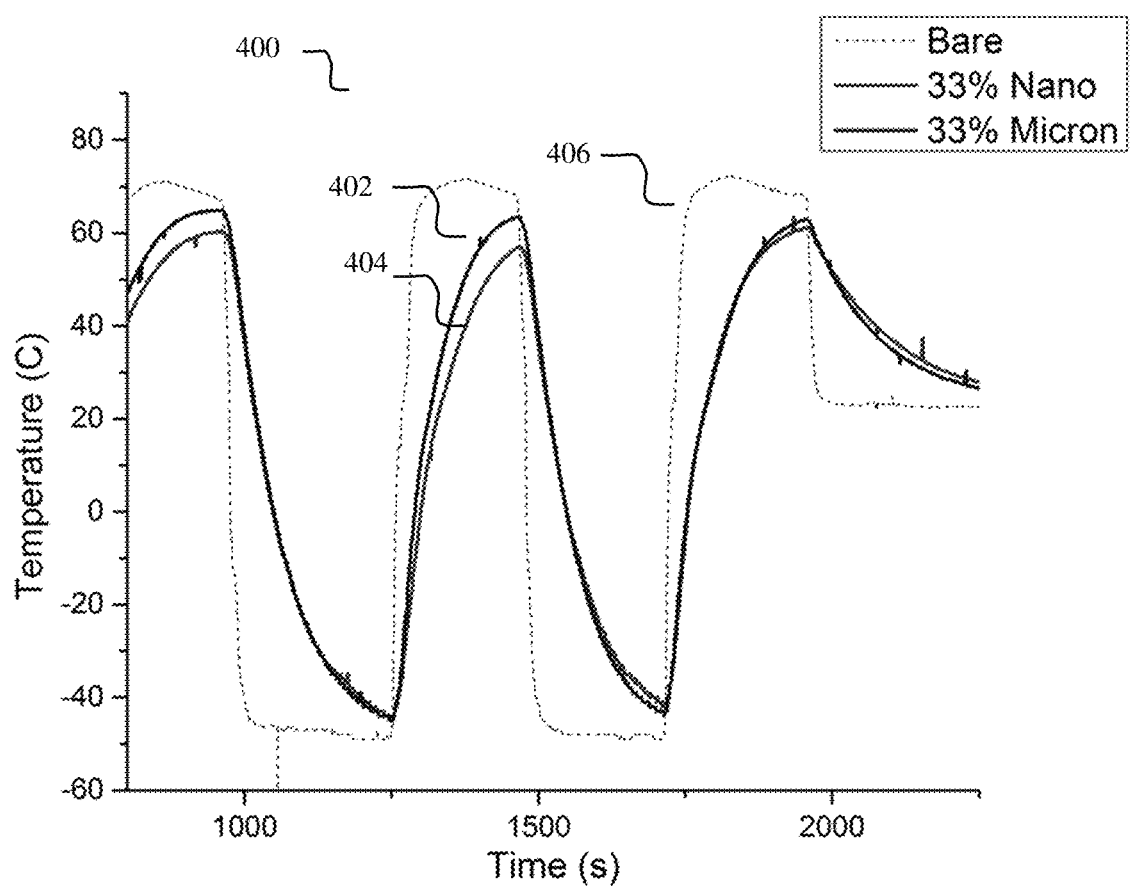
FIG. 4 is a graph showing the response rate of thermocouples potted with micron tungsten trioxide rich coating, polyurethane and a bare thermocouple under a varying thermal load, in accordance with an illustrative embodiment.
Figure 5:
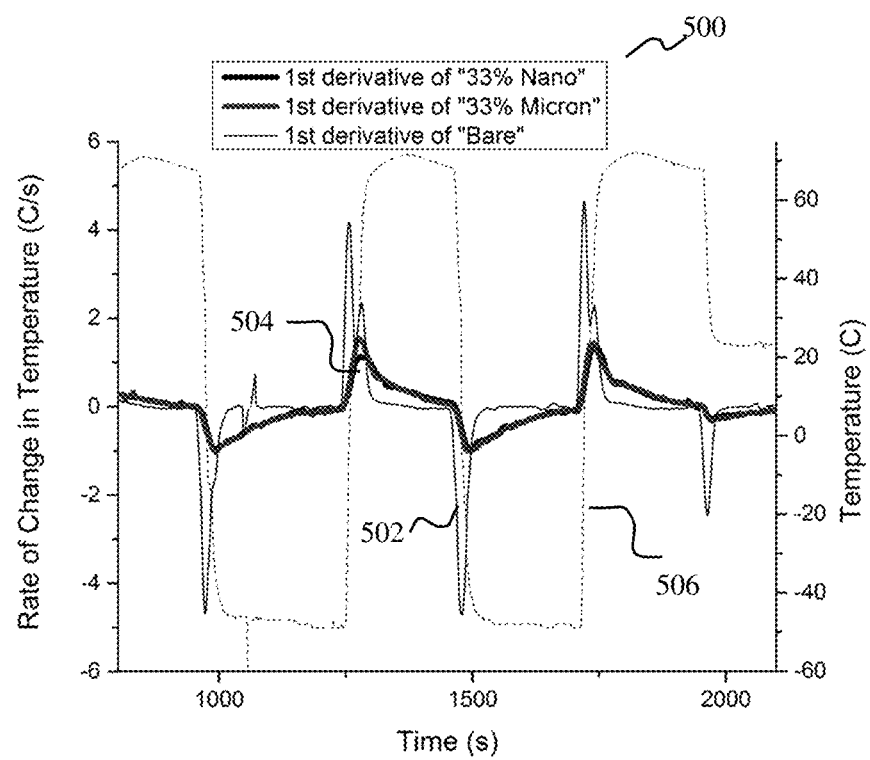
FIG. 5 is a graph showing the rate of change in temperature of thermocouples potted with micron tungsten trioxide rich coating, polyurethane and a bare thermocouple under a varying thermal load, in accordance with an illustrative embodiment.

FIG. 4 is a graph 400 showing the response rate of thermocouples potted with micron tungsten trioxide rich coating 402, nano tungsten trioxide rich coating 404, and a bare thermocouple 406 under a varying thermal load, in accordance with an illustrative embodiment. FIG. 5 is a graph 500 showing the rate of change in temperature of thermocouples potted with micron tungsten trioxide rich coating 502, nano tungsten trioxide rich coating 504, and a bare thermocouple 506 under a varying thermal load, in accordance with an illustrative embodiment. FIG. 4 shows the temperature readings of the thermocouple coated with the tungsten trioxide thermal shield 102 with nanometer sized particles and the tungsten trioxide thermal shield 102 with micrometer sized particles, both at 33% mass concentration. The thermal load on the thermocouples are shown by the dotted line. The bare thermocouple is representative of the thermal load placed on the thermal shields 102. As can be seen in FIG. 4, there is a lag between the temperature of the bare thermocouple and the thermocouples protected by the thermal shield 102.

FIG. 5 shows that the thermocouples covered in the tungsten trioxide has a lower sensitivity to the temperature change corroborated by a decrease in response rate with the temperature between −50 C and 70 C. The temperature response of the thermocouple coated in tungsten trioxide is roughly eighty percent lower than that of the bare thermocouple. This suggests that during a thermal shock event, the encapsulated component will not experience the dynamic thermal change thus improving thermal shock survivability.

FIG. 6 is a table showing test results for the heat transfer rate for the thermocouples according to particle size, concentration and thickness, in accordance with an illustrative embodiment of the invention. Heat transfer rate is calculated from the thermocouple data according to the following equations:

$$R = t/(k*A); \text{ and}$$

$$Q = \Delta T/R,$$

where R is the thermal resistance, Q is the heat transfer rate, T is temperature, t is film thickness, k is the thermal conductivity and A is the area of surface being covered. The k value was measured using a TCi thermal conductivity analyzer.

The heat transfer rate is determined for the temperature change from −50 C to ambient, from ambient to 70 C and from −50 C to 70 C. A negative heat transfer rate represents the direction of heat flow.

The average particle size for the nanometer tungsten trioxide powders is reported to be 66 nanometers and the average particle size for the micron tungsten trioxide powders is reported to be 18.9 microns. With increasing tungsten trioxide concentration, the heat transfer rate decreases. The heat transfer rates are also lower for the nanometer sized tungsten trioxide compared to the micron sized tungsten trioxide. The concentration of tungsten trioxide in the thermal shield 102 does not vary significantly for the nanometer tungsten trioxide samples; however, with increasing concentration, there will be an increase in powder packing density which will impact heat transfer through the coating.

The response of the thermocouples encapsulated in the tungsten oxide rich layer are shown to reduce the response time of the thermocouple up to 80% at 70 C and at −50 C. Moreover testing shows that the response is reproducible and stable for all grain sizes tested however is improved with nano-grained tungsten oxide. Reducing the grain size of the tungsten oxide powders will reduce the bulk thermal conductivity as well as the heat conduction behavior of the tungsten oxide rich layer in the composite coating.

While the invention has been described with reference to certain embodiments, numerous changes, alterations and modifications to the described embodiments are possible without departing from the spirit and scope of the invention as defined in the appended claims, and equivalents thereof.

What is claimed is:

1. A thermal shield for an electronic component subject to thermal shock, the thermal shield comprising tungsten trioxide grains suspended in a binder wherein the thermal shield comprises a tungsten trioxide rich layer oriented facing the electronic component and a binder rich layer.

2. An electronic component for a gun launched munition wherein the electronic component is potted in a thermal shield having a stable phase in a temperature range of 70 degrees Celsius to −50 degrees Celsius and wherein the thermal shield comprises tungsten trioxide grains having a grain size in a range of 60 nanometers to 30 microns suspended in a binder curable at room temperature and without the participation of the tungsten trioxide grains and wherein the thermal shield is organized into a tungsten trioxide rich layer adjacent the electronic component and comprising seventy-five to eighty-five percent of the tungsten trioxide grains and a binder rich layer facing an external environment.

3. The thermal shield of claim 1 wherein the tungsten trioxide rich layer comprises seventy five to eighty five percent of the tungsten trioxide grains in the thermal shield.

4. The thermal shield of claim 1 wherein a mass concentration of tungsten trioxide is in the range of nine to forty-three percent.

5. The thermal shield of claim 1 wherein grain sizes of the tungsten trioxide grains are in a range of 60 nanometers to 30 microns in size.

6. The thermal shield of claim 1 wherein the thermal shield is in a stable phase in a temperature range of 70 degrees Celsius to −50 degrees Celsius.

7. The thermal shield of claim 1 wherein the binder is polyurethane.

* * * * *